United States Patent [19]

Riccardi et al.

[11] Patent Number: 5,742,645
[45] Date of Patent: Apr. 21, 1998

[54] METHOD OF DIGITAL DEMODULATION OF A COMPOSITE SIGNAL

[75] Inventors: Guy Riccardi, Sceaux; Philippe Calvano, Villejuif; Jean-Luc Nicolas, Montrouge, all of France

[73] Assignee: Thomson - CSF, Paris, France

[21] Appl. No.: 211,237

[22] PCT Filed: Sep. 4, 1992

[86] PCT No.: PCT/FR92/00843

§ 371 Date: Mar. 29, 1994

§ 102(e) Date: Mar. 29, 1994

[87] PCT Pub. No.: WO93/07676

PCT Pub. Date: Apr. 15, 1993

[30] Foreign Application Priority Data

Oct. 8, 1991 [FR] France ................ 91 12350

[51] Int. Cl.[6] ................ H03D 3/00; H04L 27/14
[52] U.S. Cl. ............ 375/321; 364/922.8; 364/923.4; 455/46; 329/356; 332/167
[58] Field of Search .............. 375/340, 342, 375/273, 270, 301, 321, 268, 277, 323, 329, 312, 260, 219; 367/3, 4, 135, 137, 1, 2, 5, 6, 901, 903; 370/20, 138; 455/45, 46, 202, 203; 329/356; 332/167, 168, 169; 364/922.8, 923.4; 342/89, 98, 100-102

[56] References Cited

U.S. PATENT DOCUMENTS

| | | | |
|---|---|---|---|
| 4,316,058 | 2/1982 | Christensen | 370/20 X |
| 4,799,212 | 1/1989 | Mehrgardt | 370/20 |
| 4,868,792 | 9/1989 | Grado | 367/13 |
| 4,962,488 | 10/1990 | Dell-Imagine | 367/3 |

*Primary Examiner*—Young T. Tse
*Assistant Examiner*—Bryan Webster
*Attorney, Agent, or Firm*—Oblon, Spivak, McClelland, Maier & Neustadt, P.C.

[57] ABSTRACT

A method for digitally demodulating a complex modulation signal and allowing different parameters to be transmitted thereby. The input signal is baseband filtered and a complex demodulation is performed on the first subcarrier at a frequency Fp to obtain a correction signal, after squaring. The input signal is demodulated around a frequency exactly equal to twice the frequency of the first demodulation in order to obtain output signals which exhibit a frequency error with respect to 2Fp. This frequency error is corrected by multiplication with the previously derived frequency correction signal. The corrected signal is filtered at a frequency lower than 1 Hz, in order to obtain a signal giving the phase error at a frequency 0, that is to say that of the subcarrier at 2Fp. The signal makes it possible to correct the phase of signals which were previously frequency corrected in order to obtain two signals which are complementary to one another and transmitted by quadrature modulation around the frequency 2Fp.

5 Claims, 2 Drawing Sheets

METHOD OF DIGITAL DEMODULATION OF A COMPOSITE SIGNAL

BACKGROUND OF THE INVENTION

1. Field of the Invention

The present invention relates to devices which make it possible to demodulate a carrier signal of composite modulation, with digital processing. It relates more particularly to the signals transmitted by radio from a marine vehicle transporting several measurement signals in the form of a set of modulations suitably multiplexed together.

2. Discussion of the Background

In order to identify various objects situated within the sea, buoys released from a helicopter are currently used, which carry out sonar soundings. The results of these soundings are transmitted by a VHF radio set carried by the buoy to a receiver situated in the releasing helicopter, or possibly in another aircraft or vessel.

The information thus transmitted essentially comprises omnidirectional and directional detection signals and indications on the orientation of the buoy making it possible to give a reference to the directional signals. These signals modulate the HF carrier of the transmission radio set according to a defined and known modulation plan. On reception, the demodulation of the radio signal restores the measurement signals, which make it possible to know the location of the objects to be identified.

The technique universally used up to the present is to demodulate this signal by conventional analogue means, including for example filters, multipliers, etc.

A method was proposed in the Patent U.S. Pat. No. 4,356,562 for digital demodulation of these signals. However, the system proposed uses a variable sampling frequency slaved to the fluctuation of the carrier frequency, which very greatly complicates the digital processing of the signals thus sampled.

SUMMARY OF THE INVENTION

In order to alleviate these drawbacks, the invention proposes a method of digital demodulation of a composite signal comprising a first omnidirectional baseband signal, a first subcarrier at a first frequency Fp, a second subcarrier at a frequency 2Fp exactly equal to double the frequency Fp, a first dipolar signal modulating the second subcarrier in double sideband mode with carrier suppression, and a second dipolar signal modulating the second subcarrier in double sideband mode with carrier suppression in quadrature with the first signal, mainly characterized in that the following steps are performed:

low-pass filtering in order to isolate the omnidirectional signal;

complex demodulation by a very stable frequency F0 hardly different from Fp in order to obtain a first signal of the frequency difference between F0 and Fp;

complex squaring then normalization of the conjugate signal of this first error signal in order to obtain a first frequency-correction signal;

complex demodulation around a second frequency at the frequency 2F0 exactly equal to twice the frequency F0 in order to obtain a first approximation to the two dipolar signals;

complex multiplication of this first approximation of dipolar signals by the first frequency-correction signal in order to obtain frequency-corrected dipolar signals;

very narrow-band, low-pass filtering of these frequency-corrected dipolar signals in order to isolate the DC component corresponding to the second subcarrier brought back to the frequency 0;

derivation of a phase-correction signal from this component at the frequency 0;

complex multiplication of the dipolar signals frequency corrected by this phase-error signal in order to obtain the frequency- and phase-corrected dipolar signals.

BRIEF DESCRIPTION OF THE DRAWINGS

Other features and advantages of the invention will appear clearly in the following description, given by way of a non-limiting example, with regard to the attached figures which represent.

DESCRIPTION OF THE PREFERRED EMBODIMENT

Figure 1:
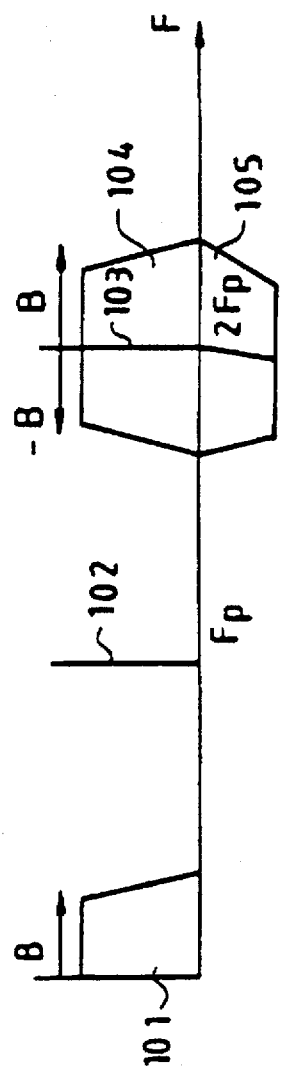
FIG. 1, the frequency plan of the signal to be demodulated.

The composite modulation signal of the HF carrier represented in FIG. 1 corresponds to a set of signals and of modulations generally used in sonar buoys. It comprises:

A first baseband signal 101 which makes it possible to transmit the omnidirectional reception signals of the sonar. These signals are known as "omni signal". The bandwidth of this signal is 2400 Hz, for example.

A first pure subcarrier 102 of frequency Fp equal, for example, to 7.5 kHz serves as reference. Having regard to the rudimentary means available in the buoy allowing this frequency to be generated, the latter varies randomly, for example by ±25 Hz. It is this variation which poses the main problems for the subsequent processing.

A second pure subcarrier 103 at the frequency 2Fp exactly equal to double that of the first subcarrier. For that purpose, the second subcarrier is generated simply by frequency doubling of the first, which allows a perfect correspondence between the frequencies to be obtained. Needless to say, this second frequency varies according to the variations in the first one, within double limits, obviously, that is to say, for example, ±50 hertz. It should be noted that this system does not guarantee a constant phase offset between the two subcarriers, and that in fact this phase offset varies randomly.

A first signal, called "cosine channel", corresponding to the sonar signals received in a first favoured direction, east-west in principle if the buoy is correctly oriented, modulates the second subcarrier in double sideband with carrier-suppression mode (the subcarrier 102 is added later) and a phase shift obtained from indications from a member, a compass for example, which measures the orientation (or heading) of the buoy + in the example described 90°. This latter indication is intended in the subsequent processing to correctly orient the directional signal obtained from this sonar. Thus the modulation signal 104 is obtained.

Another signal known as "sine channel" corresponding to the sonar signals received in another favoured channel situated at 90° to the preceding one, thus north-south in principle, modulates the subcarrier in the same way as the preceding one, but in quadrature with respect to this modulation. Thus the modulation signal 105 is obtained.

In fact, in the presence of a single source of noise (or of an echo), the north/south and east/west signals are the same, but multiplied by sine$\Theta$ in one case and cos$\Theta$ in the other, $\Theta$ being the orientation of the source with respect to the cross dipoles which form the favoured reception channels. For this reason these signals are called "dipolar signals".

In the receiver, situated, for example, in the releasing helicopter, the VHF signal is demodulated in the known way, which, at this level, causes no particular stability problem. Thus the composite modulation signal represented in FIG. 1 is obtained. The invention makes it possible to demodulate and demultiplex this signal in a precise way by using a digital processing in order to obtain the signals giving the omnidirectional, east-west and north-south reception indications from the sonar, as well as the orientation of the north-south directional reception members of the sonar.

The signal e(t) obtained after demodulation of the VHF signal, the spectrum of which is represented in FIG. 1, may be expressed with the following formula and notations:

s(t): omni signal
Fp: value of the frequency of the frequency reference signal
$A_{F_p}$: amplitude of a frequency reference signal
$A_{2F_p}$: amplitude of the phase reference signal
$\phi_{F_p}$: phase shift between the two reference signals (random variable)
$\Theta$: azimuth of the source
K: heading (angle between the magnetic north and the axis of the buoy)
$A_D$: amplitude of the dipolar signals $$A_z = \Theta + K: \text{azimuth of the source} \quad (1)$$

$$e(t) = s(t) + A_{Fp} \cdot \cos(2\pi Fpt - \phi Fp) + A_{2Fp} \cdot \cos(4\pi Fpt) + A_D s(t)\cos\left(4\pi Fpt + \pi + \frac{A_z}{2}\right)$$

Figure 2:
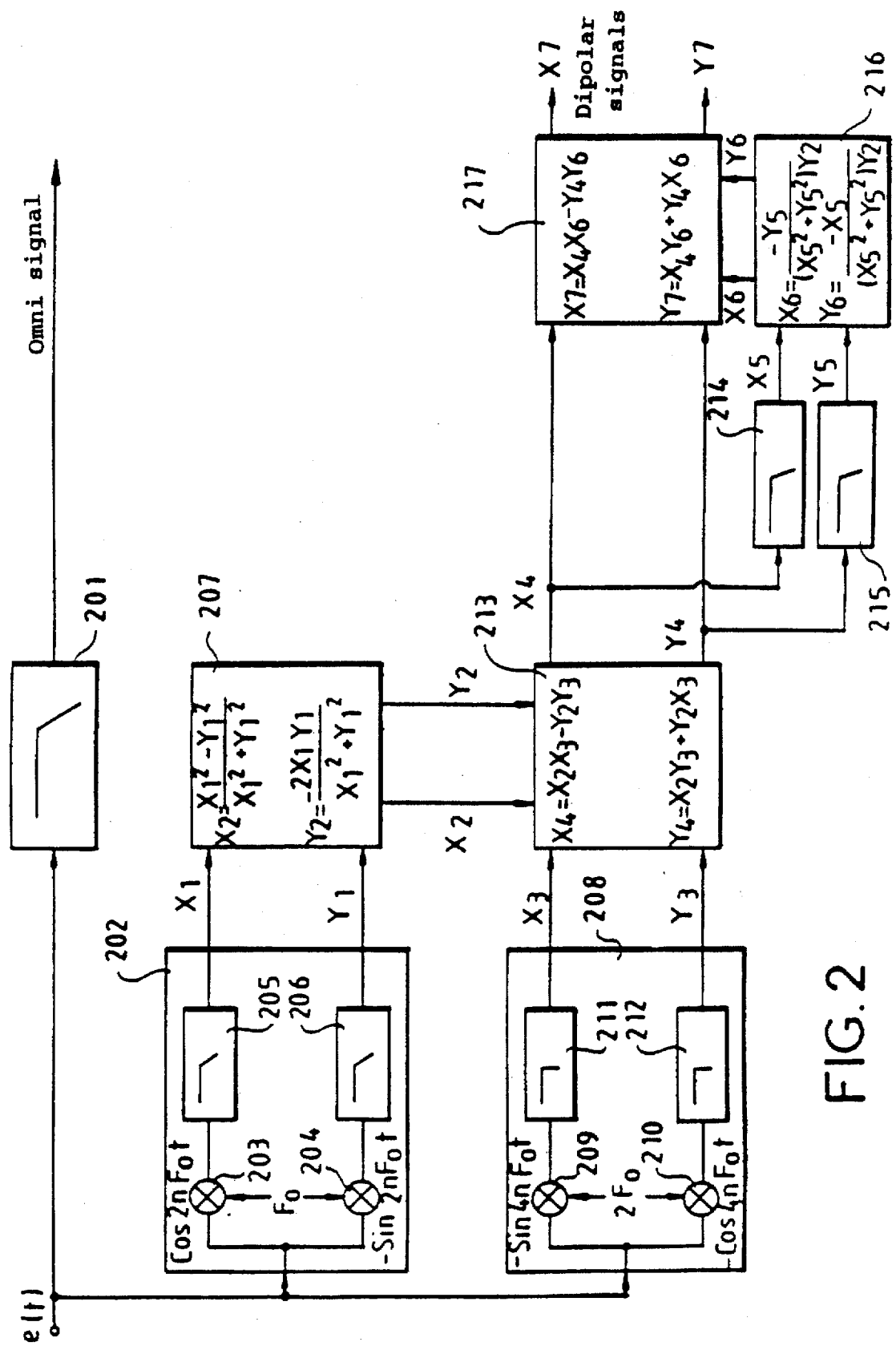
FIG. 2, the diagram of a demodulation device according to the invention.

This signal e(t) is applied to the input of a digital demodulation device making it possible to implement the method according to the invention, the theoretical block diagram of which is represented in FIG. 2.

In order to obtain the omni signal, the signal e(t) is quite simply filtered by a low-pass filter 201 the cutoff frequency of which makes it possible to reject the high frequencies, at least from Fp, while letting through, with a minimum of distortion, the omni signal represented at 101 in FIG. 1. This frequency, in the digital example described, is 2.56 kHz, for example.

In order to demodulate the signals 104 and 105 in a complex way, so as to bring the dipolar signals into baseband, it is necessary to start with a frequency identical to the carrier 103. It is not possible to isolate this carrier directly by a narrow filtering centred on 2Fp, since the variations in this frequency are greater than the width of the necessary filter. In fact, the sideband-modulated dipolar signals 104 and 105 include frequencies which are very close to 2Fp.

The invention takes advantage of the fact that this carrier 103 at 2Fp is obtained by doubling the frequency of the carrier 102 at Fp, which is isolated outside the bands of modulation by the signals originating from the sonar. Starting with this observation, the offset $\delta F$ of the first subcarrier 102 with respect to a fixed and very stable frequency F0 is measured, i.e. $\delta F = Fp - F0$, and this offset serves to correct the demodulation of the modulated signals 104 and 105 with respect to another stable frequency 2F0 obtained by doubling the first one. The value of F0 will preferably be chosen to be close to the mean theoretical value of Fp.

Thus a complex demodulation of e(t) is carried out with the aid of the frequency F0 in a demodulator 202. To do that, e(t) is multiplied conventionally by the quadrature components of F0 in multipliers 203 and 204. The modulation products are next filtered in two low-pass filters 205 and 206 which are identical to the filter 201 which delivers the two quadrature components of the frequency offset $\delta F$, i.e. $X_1$ and $Y_1$. These filters are of the linear-phase FIR type. In a general way, the set of filters used in the processing of the signals in the device are of this FIR type. The cutoff frequency of the filters 205 and 206 is such that it makes it possible to frame the variations in the frequency Fp, possibly taking account of a constant offset between F0 and the mean value of Fp if the latter are not identical. In the digital example described above, where Fp can vary by 25 Hz and where F0 is equal to 7489.8 Hz, filters with a cutoff be used subsequently, frequency doubling of the error frequency of 36 Hz will be taken, for example.

In order then to obtain the corrector term to signal thus obtained is carried out in a multiplier 207 in which the conjugate signal of the error signal delivered by the demodulator 202 is squared, normalizing it in amplitude to the square. This operation makes it possible to obtain the components of the complex frequency-correction signal $X_2$ and $Y_2$ given by the formulae:

$$X_2 = (X_1^2 - Y_1^2)/(X_1^2 + Y_1^2) \quad (2)$$

$$Y_2 = -2X_1Y_1/(X_1^2 + Y_1^2) \quad (3)$$

First of all a first approximation of the dipolar signals is obtained by carrying out complex demodulation of e(t) by a signal at frequency 2F0 obtained directly by doubling the signal at F0 used in the demodulator 202. This operation is performed in a complex demodulator 208, which, in the same way as the demodulator 202, uses two multipliers 209 and 210 followed by two identical low-pass filters 211 and 212, the passband of which is intended to let through the components of the dipolar signals, taking account of the maximum frequency offset between 2F0 and 2Fp. In the digital example seen above, the passband of these filters will, for example, be 2.56 kHz, that is to say the same as the passband of the filter 201. Thus components $X_3$ and $Y_3$ are obtained.

In order to correct this first approximation in frequency, the corresponding complex signal, of which $X_3$ and $Y_3$ represent the components, is multiplied by the complex signal representing the frequency offset obtained at the output of the multiplier 207, and of which $X_2$ and $Y_2$ themselves also represent the components. This operation is performed in a multiplier 213 and is represented by the formulae:

$$X_4 = X_2 X_3 - Y_2 Y_2 \quad (4)$$

$$Y_4 = X_2 Y_3 + Y_2 X_3 \quad (5)$$

In fact, the dipolar signals represented by $X_4$ and $Y_4$ are properly corrected in frequency in order to correspond to the demodulation according to the subcarrier at 2Fp, but they are affected by phase errors with various origins.

Certain phase errors are introduced by the system, for example by the residual errors in the filters or in the multipliers, and corrections to them by sampling could be devised.

In contrast, a significant phase error corresponds to the phase difference between the subcarrier at 2Fp and the demodulation frequency at 2F0. The latter is, by nature, random, and a means has to be found to correct it.

To do that, filtering with a very narrow passband (maximum 1 Hz) is carried out on the components $X_4$ and $Y_4$, respectively in two identical filters 214 and 215 which deliver output signals $X_5$ and $Y_5$. These filters make it possible to isolate the quasi-DC component of the signal originating from the demodulation of the dipolar signals which in fact represent the subcarrier at 2Fp brought back to a zero frequency in the phase space. Then by choosing, for the filters 214 and 215, filters having a zero phase error at this 0 frequency, a complex signal is then obtained which represents the phase offset between the subcarrier at 2Fp and the frequency at 2F0. The components of this complex signal are $X_5$ and $Y_5$. What makes it possible, and even relatively easy, to obtain filters having such a characteristic is the fact that the zero phase offset has to be obtained at the 0 frequency and over a very narrow passband.

In order then to be able to correct, in phase, the frequency-corrected dipolar signals obtained at the output of the multiplier 213, the complex signal which represents them is multiplied by a correction signal obtained from the complex signal represented $X_5$ and $Y_5$. This second correction signal is derived in a calculating module 216 which makes it possible to obtain the signals $X_6$ and $Y_6$ given by the formulae:

$$X_6 = -Y_5/(X_5^2+Y_5^2)^{1/2} \quad (6)$$

$$Y_6 = -X_5/(X_5^2+Y_5^2)^{1/2} \quad (7)$$

From these signals $X_6$ and $Y_6$, the signals $X_4$ and $Y_4$ are thus corrected in a complex multiplication module 217, which delivers the entirely corrected dipolar signals $X_7$ and $Y_7$ given by the formulae:

$$X_7 = X_4 X_6 - Y_4 Y_6 \quad (8)$$

$$Y_7 = X_4 Y_6 + Y_4 X_6 \quad (9)$$

As has already been pointed out, all these processings are done in digital mode in a computer system, for example based on a suitably programmed microprocessor. The calculations are therefore done on digitized samples e(t) which arrive at the input of the device, and the output signals, both omni and dipolar, are therefore themselves samples e(t) which frequency will, obviously, be chosen to meet the Nyquist criterion. As the signals are relatively low-frequency signals, the sampling frequency can in fact be markedly higher, which will make it possible more easily to obtain the characteristics for the various filters used, which are, needless to say, digital filters included in the programming. Having regard to the interpretation devices used afterwards and receiving the demodulation signals, it is beneficial, by way of a variant of the invention, to use a sampling frequency matched to these devices, for example a spectrum analyser.

Hence, in a particular embodiment, a sampling frequency Fs equal to $2^{16}/10$ Hz, i.e. 6553.6 Hz is used.

In these conditions, in order to avoid intermodulation and spurious signals being taken into account, it will be beneficial to choose a frequency F0 equal to a rational frequency of Fs, i.e., for example, F0=8 Fs/7. 2F0 will then be equal to 16 Fs/7, but, in contrast, it would be possible, for the phase-correction calculations within the filters 214 and 215, to use a much lower sampling frequency, since these signals change very slowly over time. This frequency will, for example, be equal to Fs/64.

Another variant would consist, within the phase correction in the multiplier 217, in introducing a correction term derived in the signal processing means, in order, for example, to be able to obtain a specific characteristic of the dipolar signals, for example putting the omni signal back in phase in such a way as to perform different processings, such as, for example, the derivation of a cardioid.

We claim:

1. Method of digital demodulation of a composite signal comprising a first omnidirectional baseband signal, a first subcarrier at a first frequency Fp, a second subcarrier at a frequency 2Fp exactly equal to double the frequency Fp, a first dipolar signal modulating the second subcarrier in double sideband mode with carrier suppression, and a second dipolar signal modulating the second subcarrier in double sideband mode with carrier suppression in quadrature with the first dipolar signal, comprising the steps of:

low-pass filtering the composite signal to isolate the omnidirectional signal;

complex demodulating of the composite signal by a very stable frequency F0 which differs from Fp by a small amount to obtain an error signal of frequency difference between F0 and Fp;

complex squaring and normalizing the conjugate signal of the error signal to obtain a first frequency-correction signal;

complex demodulating of the composite signal by a stable frequency 2F0 exactly equal to twice the frequency F0 to obtain a first approximation of the two dipolar signals;

complex multiplying the first approximation of the two dipolar signals by the first frequency-correction signal to obtain frequency-corrected dipolar signals;

very narrow-band, low-pass filtering of said frequency-corrected dipolar signals to isolate the DC component corresponding to the second subcarrier brought back to the frequency F0;

deriving of a phase-correction signal from said DC component at the frequency F0;

complex multiplying the frequency-corrected dipolar signals by said phase-correction signal to obtain frequency- and phase-corrected dipolar signals.

2. Method of digital demodulation of a composite signal comprising a first omnidirectional baseband signal, a first subcarrier at a first frequency Fp, a second subcarrier at a frequency 2Fp exactly equal to double the frequency Fp, a first dipolar signal modulating the second subcarrier in double sideband mode with carrier suppression, and a second dipolar signal modulating the second subcarrier in double sideband mode with carrier suppression in quadrature with the first dipolar signal, comprising the steps of:

low-pass filtering the composite signal to isolate the omnidirectional signal;

complex demodulating of the composite signal by a very stable frequency F0 which differs from Fp by a small amount to obtain an error signal of frequency difference between F0 and Fp;

complex squaring and normalizing the conjugate signal of the error signal to obtain a first frequency-correction signal;

complex demodulating of the composite signal by a stable frequency 2F0 exactly equal to twice the frequency F0 to obtain a first approximation of the two dipolar signals including a filtering over the same bandwidth as the low-pass filtering to deliver the omnidirectional signal;

complex multiplying the first approximation of the two dipolar signals by the first frequency-correction signal to obtain frequency-corrected dipolar signals;

very narrow-band, low-pass filtering of said frequency-corrected dipolar signals to isolate the DC component corresponding to the second subcarrier brought back to the frequency F0;

derivation of a phase-correction signal from said DC component at the frequency F0;

complex multiplying of the frequency-corrected dipolar signals by said phase-correction signal to obtain frequency- and phase-corrected dipolar signals.

3. Method of digital demodulation of a composite signal comprising a first omnidirectional baseband signal, a first subcarrier at a first frequency Fp, a second subcarrier at a frequency 2Fp exactly equal to double the frequency Fp, a first dipolar signal modulating the second subcarrier in double sideband mode with carrier suppression, and a second dipolar signal modulating the second subcarrier in double sideband mode with carrier suppression in quadrature with the first dipolar signal, comprising the steps of:

low-pass filtering the composite signal to isolate the omnidirectional signal;

complex demodulating the composite signal by a very stable frequency F0 which differs from Fp by a small amount to obtain an error signal of frequency difference between F0 and Fp;

complex squaring and normalizing the conjugate signal of the error signal to obtain a first frequency-correction signal;

complex demodulating of the composite signal a stable frequency 2F0 exactly equal to twice the frequency F0 to obtain a first approximation of the two dipolar signals;

complex multiplying the first approximation of the two dipolar signals by the first frequency-correction signal to obtain frequency-corrected dipolar signals;

very narrow-band, low-pass filtering of said frequency-corrected dipolar signals to isolate the DC component corresponding to the second subcarrier brought back to the frequency F0, having a cut-off frequency substantially equal to 1 Hz;

derivation of a phase-correction signal from said DC component at the frequency F0;

complex multiplication of the frequency-corrected dipolar signals by said phase-correction signal to obtain frequency- and phase-corrected dipolar signals.

4. Method according to any one of claims 1 to 3, wherein a complimentary correction is introduced into the complex multiplication which makes it possible to obtain the phased correction of the dipolar signals, the complimentary correction making it possible to introduce a deliberate phase variation of the dipolar signals to facilitate the subsequent processing of the latter.

5. Method according to claim 4, wherein this deliberate modification of the dipolar signals consists in putting them back in phase with the omnidirectional signal obtained in the low-pass filtering step.

* * * * *